(12) United States Patent
Liu et al.

(10) Patent No.: US 12,690,204 B2
(45) Date of Patent: Jul. 21, 2026

(54) GaN-BASED TRENCH METAL OXIDE SCHOTTKY BARRIER DIODE AND PREPARATION METHOD THEREFOR

(71) Applicant: SUN YAT-SEN UNIVERSITY, Guangdong (CN)

(72) Inventors: Yang Liu, Guangdong (CN); Yuhao Zhou, Guangdong (CN)

(73) Assignee: SUN YAT-SEN UNIVERSITY, Guangdong (CN)

( * ) Notice: Subject to any disclaimer, the term of this patent is extended or adjusted under 35 U.S.C. 154(b) by 426 days.

(21) Appl. No.: 18/270,496

(22) PCT Filed: Sep. 22, 2021

(86) PCT No.: PCT/CN2021/119549
§ 371 (c)(1),
(2) Date: Jun. 30, 2023

(87) PCT Pub. No.: WO2023/039918
PCT Pub. Date: Mar. 23, 2023

(65) Prior Publication Data
US 2024/0063311 A1 Feb. 22, 2024

(30) Foreign Application Priority Data

Sep. 18, 2021 (CN) .......................... 202111100955.0

(51) Int. Cl.
*H10D 8/60* (2025.01)
*H10D 8/01* (2025.01)
(Continued)

(52) U.S. Cl.
CPC ............. *H10D 8/605* (2025.01); *H10D 8/051* (2025.01); *H10D 62/8503* (2025.01);
(Continued)

(58) Field of Classification Search
CPC .... H10D 8/605; H10D 8/051; H10D 62/8503;
H10D 62/106; H10D 64/23;
(Continued)

(56) References Cited

U.S. PATENT DOCUMENTS 6,172,383 B1 * 1/2001 Williams ............. H03K 17/163
257/341
9,082,628 B2 7/2015 Qu
(Continued)

FOREIGN PATENT DOCUMENTS

| CN | 104269445 | 1/2015 |
|---|---|---|
| CN | 105633172 | 6/2016 |
| JP | 2010147399 | 7/2010 |

OTHER PUBLICATIONS

"International Search Report (Form PCT/ISA/210) of PCT/CN2021/119549," mailed on May 31, 2022, with English translation thereof, pp. 1-4.

*Primary Examiner* — Steven B Gauthier
*Assistant Examiner* — Khatib A Rahman
(74) *Attorney, Agent, or Firm* — JCIPRNET

(57) ABSTRACT

The invention relates to a GaN-based trench metal oxide Schottky barrier diode and a preparation method therefor. The device structure from bottom to top includes: an ohmic contact metal layer covering a substrate i.e., cathode; a GaN self-supporting substrate; an n-type lightly doped epitaxial layer; a p-type high-concentration GaN layer arranged in parallel; a dielectric layer in the trench; a metal layer convering the upper surface of the device i.e., the anode. The p-type high-concentration GaN layer with high carrier concentration can be obtained by using a selective area epitaxial method to form the p-type high-concentration GaN layer. Then the dielectric layer is deposited, and a contact hole is provided on the dielectric layer, subsequently the anode (Continued)

metal is connected to the p-type high-concentration GaN layer through the contact hole, forming the ohmic contact.

3 Claims, 7 Drawing Sheets

(51) Int. Cl.

| | |
|---|---|
| *H10D 62/85* | (2025.01) |
| *H10D 64/01* | (2025.01) |
| *H10P 50/00* | (2026.01) |
| *H10P 50/64* | (2026.01) |

(52) U.S. Cl.

CPC ....... *H10D 64/0116* (2026.01); *H10P 50/646* (2026.01); *H10P 50/691* (2026.01)

(58) Field of Classification Search

CPC .. H10D 62/107; H10D 62/103; H10D 62/124; H01L 21/28575; H01L 21/30612; H01L 21/308

See application file for complete search history.

(56) References Cited

U.S. PATENT DOCUMENTS

| | | | | |
|---|---|---|---|---|
| 10,418,445 | B2 * | 9/2019 | Ryo ........................ | H10D 62/53 |
| 10,586,703 | B2 * | 3/2020 | Wakimoto ......... | H10D 62/8325 |
| 10,672,917 | B2 * | 6/2020 | Pei ........................ | H10D 62/824 |
| 10,903,333 | B2 * | 1/2021 | Cao ...................... | H10D 64/693 |
| 11,894,468 | B2 * | 2/2024 | Li ........................ | H10D 64/117 |
| 12,464,747 | B2 * | 11/2025 | Yilmaz ................ | H10D 30/668 |
| 2008/0128850 | A1 * | 6/2008 | Goerlach .............. | H10D 8/051 |
| | | | | 438/570 |
| 2014/0001489 | A1 * | 1/2014 | Yen ........................ | H10D 8/605 |
| | | | | 257/77 |
| 2021/0384362 | A1 * | 12/2021 | Li ........................... | H10D 62/60 |

* cited by examiner

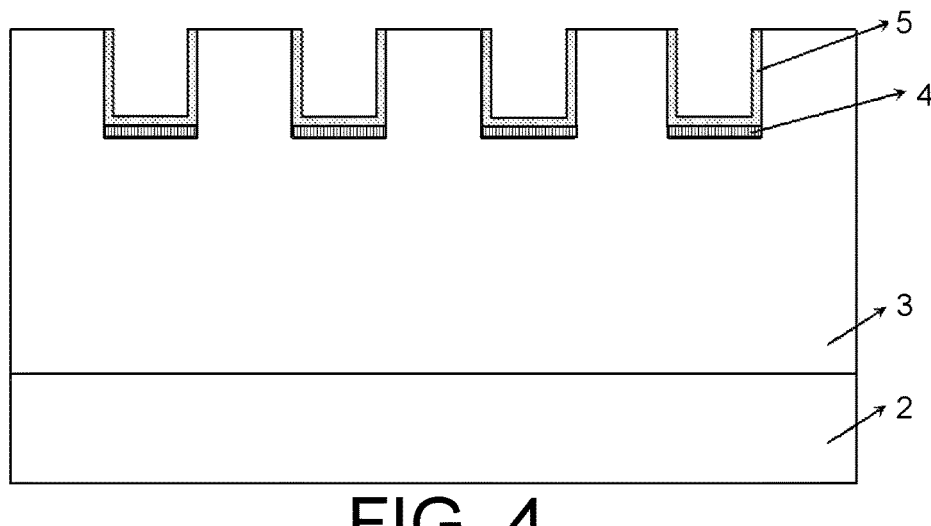
FIG. 4
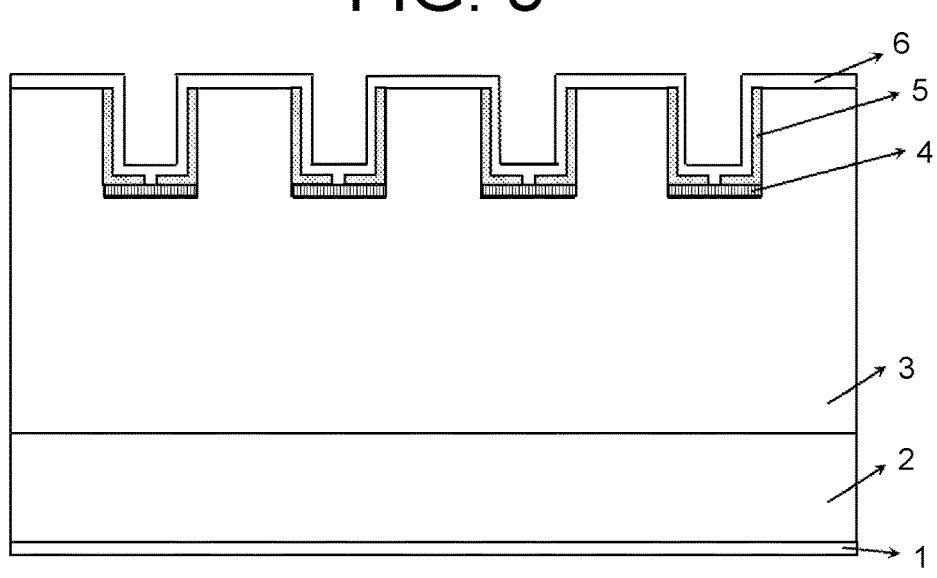
FIG. 5
FIG. 6

GaN-BASED TRENCH METAL OXIDE SCHOTTKY BARRIER DIODE AND PREPARATION METHOD THEREFOR

CROSS-REFERENCE TO RELATED APPLICATION

This application is a 371 of international application of PCT application serial no. PCT/CN2021/119549, filed on Sep. 22, 2021, which claims the priority benefit of China application no. 202111100955.0, filed on Sep. 18, 2021. The entirety of each of the above mentioned patent applications is hereby incorporated by reference herein and made a part of this specification.

TECHNICAL FIELD

The invention belongs to the field of semiconductor power electronic devices, in particular relates to a GaN-based trench metal oxide Schottky barrier diode and a preparation method therefor.

BACKGROUND

Schottky diode has the advantages of forward voltage reduction, high switching frequency, and is widely used in various fields of power electronics, such as switching power supply, drive circuit. Most of the traditional Schottky diodes are made of Si materials. The silicon-based power devices have reached their theoretical limits, and the increase of power density tends to be saturated, so they can not meet people's demand for high voltage and high power density of electronic products. GaN material has high critical breakdown field strength, high electron mobility, and thus has a large Baliga's figure of merit (BFOM), which can fundamentally break through the theoretical limit of Si devices from the physical characteristics. Therefore, it is of great value to develop GaN Schottky diodes.

However, the traditional Schottky diode also has the disadvantage of large reverse leakage current, which will make the device soft breakdown and reduce the breakdown voltage. This is due to the mirror barrier reduction effect of Schottky junction and tunnel leakage under strong reverse bias. In order to solve this problem, the method adopted is to reduce the electric field on the surface of the Schottky junction by shielding the depletion region under the Schottky junction using the principle of charge coupling. Devices using this principle began with junction barrier Schottky diodes (JBS), and later developed the trench MOS barrier Schottky diodes (TMBS). TMBS devices work as follows: in the forward bias, the Schottky junction opens, the opening voltage is small, retaining the excellent positive conduction characteristics of the Schottky diode; under reverse bias, the MOS structure deplete the n-type epitaxial layer, between the trench, and reduces the surface electric field, thus reducing the leakage current and improving the breakdown voltage of the device. Compared with JBS structure, TMBS structure has the following advantages:

1. The preparation process is simple, and there is no need to form p-GaN region, eliminating the ion implantation or epitaxial p-GaN process steps, and it only need to etch the trench after the deposition of a dielectric layer, greatly simplifying the process flow.
2. Shielding Schottky surface electric field ability is stronger. In reverse state, JBS depends on the pn junction transverse depletion expansion to pinch off the channel. But the doping of p-GaN region is not uniform in the formation process, the acceptor impurity of the sidewall is much less than that of the bottom of the trench, which leads to insufficient lateral depletion. So the ability to shield surface electric field of Schottky junction decreased. In contrast, MOS structure is not troubled by that because of the stronger lateral depletion effect.

High-powered TMBS devices can achieve a good compromise between the positive on-resistance and breakdown voltage. There have been some reports on GaN-based TMBS, but most of them focus on how to improve the breakdown voltage. At present, GaN-based TMBS are faced with the following two main problems:

1. The electric field in the dielectric layer at the trench corner of GaN-based TMBS device is very large. Under long-time reverse bias, it will bring fatigue of the dielectric layer and cause unreliability.
2. Poor anti-surge current ability. Power devices in the application of actual electronic circuits, often encounter current overrush or oscillation, which is easy to lead device failure. Because TMBS devices are unipolar devices, and the voltage drop will increase greatly when the TMBS devices are working in high current density state, resulting in the decrease of surge reliability of devices. In order to improve the overall circuit stability, it is often necessary to take anti-surge measures. The common method is to use surge protection devices, so that the surge current through the protection device bypass to the ground. But the introduction of protection devices will increase the overall volume, and is not conducive to integration, so it is very important to improve the anti-surge ability of TMBS devices.

SUMMARY

Therefore, in order to solve the existing defects in the prior art, the invention provides a GaN-based trench metal oxide Schottky barrier diode and a preparation method therefor.

In order to solve the above technical problems, the invention adopts the following technical solutions: a GaN-based trench metal oxide Schottky barrier diode, including: an ohmic contact metal layer covering a substrate—cathode, a GaN self-supporting substrate, an n-type lightly doped epitaxial layer, a p-type high-concentration GaN layer located in a bottom of a trench, a dielectric layer on an inner surface of the trench, a metal layer located on an upper surface—the anode, wherein a plurality of parallel arranged trench structures are formed on a surface of the n-type lightly doped epitaxial layer.

In one of the embodiments, the dielectric layer covers on an inner wall of the trench and located above the p-type high-concentration GaN layer, and a window is provided on a middle position above the p-type high-concentration GaN layer.

In one of the embodiments, no dielectric layer is provided above the p-type high-concentration GaN layer, only the dielectric layer on a side wall of the trench is retained, and the dielectric layer extends to a mesa of the n-type lightly doped epitaxial layer.

In one of the embodiments, a tilt angle of a mesa of the GaN-based trench metal oxide Schottky barrier diode is less than 90 degree, and the trench is fully filled with the metal layer—the anode.

In one of the embodiments, the p-type high-concentration GaN layer is also provided on a side wall of the trench.

In one of the embodiments, the substrate is an n-type GaN self-supporting substrate, a resistivity range of the substrate is 0.001 Ω·cm to 0.05 Ω·cm, an thickness of the substrate is 350 μm to 400 μm.

In one of the embodiments, the n-type lightly doped epitaxial layer is an unintentionally doped epitaxial layer, Si-doped epitaxial layer, or As-doped epitaxy layer; an thickness of the n-type lightly doped epitaxial layer is 1 μm to 30 μm, and an doping concentration of the n-type lightly doped epitaxial layer is $1 \times 10^{14}$ cm$^{-3}$ to $5 \times 10^{17}$ cm$^{-3}$.

In one of the embodiments, the p-type high-concentration GaN layer is p-GaN material formed by epitaxy, an thickness of the p-type high-concentration GaN layer is 0.2 μm to 2 μm, an hole concentration of the p-type high-concentration GaN layer is $1 \times 10^{16}$ cm$^{-3}$ to $1 \times 10^{19}$ cm$^{-3}$.

In one of the embodiments, the dielectric layer is $SiO_2$, $Al_2O_3$, $Si_3N_4$, or $HfO_2$, and a thickness of the dielectric layer is 0.05 μm to 0.6 μm.

In one of the embodiments, material of the ohmic contact metal layer covering the substrate—the cathode is any one of Ti/Al/Ni/Au alloy, Ti/Al/Ti/Au alloy, Ti/Al/Mo/Au alloy, and Ti/Al/Ti/TiN alloy.

In one of the embodiments, material of the metal layer located on an upper surface of the GaN-based trench metal oxide Schottky barrier diode—the anode is one of Ni, Au, Be, Pt and Pd or a stacking structure of Ni, Au, Be, Pt and Pd.

The invention further provides a preparation method for a GaN-based trench metal oxide Schottky barrier diode, including the following steps:

S1. epitaxially growing an n-type lightly doped epitaxial layer on a GaN self-supporting substrate;

S2. depositing $SiO_2$ on an n-type lightly doped epitaxial layer as a mask layer by PECVD, and removing the mask at a position of a trench of the GaN-based trench metal oxide Schottky barrier diode;

S3. etching the n-type lightly doped epitaxial layer by ICP to form the trench, and removing a photoresist by acetone after etching;

S4. epitaxially growing a p-type high-concentration GaN layer with a certain thickness by using the mask layer $SiO_2$ as a blocking layer;

S5. depositing, by ALD, a dielectric layer on a surface of the GaN-based trench metal oxide Schottky barrier diode and then removing the mask on a Schottky junction with buffered hydrofluoric acid;

S6. defining, by Lithographic development, a position where the dielectric layer contacts a window, removing the dielectric layer at the window with buffered hydrofluoric acid, and exposing the p-type high-concentration GaN layer;

S7. evaporating, by using electron beam evaporation or magnetron sputtering, a Ti/Al/Ni/Au metal on the substrate, and forming, by annealing, an ohmic contact to be cathode of the GaN-based trench metal oxide Schottky barrier diode;

S8. evaporating, by using electron beam evaporation or magnetron sputtering, a Ni/Au metal as an anode of the GaN-based trench metal oxide Schottky barrier diode on a front side of the GaN-based trench metal oxide Schottky barrier diode.

In the present invention, in order to solve the reliability problem caused by excessive electric field in the dielectric layer at the trench corner of GaN-based TMBS, the method of epitaxy is adopted to form a p-GaN region with high concentration at the bottom of the trench. In order to solve the problem of weak anti-surge current ability of GaN-based TMBS devices, a window is firstly arranged on the dielectric layer, and then the deposited anode metal is connected to the p-GaN region through the window, so that the drift region can be injected with minority carrier, resulting in conductivity modulation phenomenon.

In one of the embodiments, in the steps S1 and S4, the n-type lightly doped epitaxial layer and the p-type high-concentration GaN layer of the GaN-based trench metal oxide Schottky barrier diode are epitaxially grown by adopting methods of MBE and HYPE.

In one of the embodiments, in the step S5, the dielectric layer is deposited by adopting PECVD, HDPCVD, or LPCVD.

In one of the embodiments, in the step S3, the n-type lightly doped epitaxial layer is etched by adopting ICP etching, reactive ion etching and TMAH wet etching.

In one of the embodiments, in the step S8, the metal is also subjected to high temperature thermal anneal after evaporation, and the Ni/Au metal forms Schottky contact with the n-type drift region and forms ohmic contact with the p-type GaN region.

In one of the embodiments, in the step S3, the depth of the trench of the n-type lightly doped epitaxial layer is 1 μm to 6 μm and the width of the trench is 2 μm.

In one of the embodiments, in the step S4, the p-type high-concentration GaN layer includes a lot of parallel arranged GaN strips with a width of 2 μm and a spacing of 1 μm to 4 μm between adjacent GaN strips.

In one of the embodiments, the step S2 specifically includes:

S21. depositing 1 μm to 20 μm $SiO_2$ mask layer on the n-type lightly doped epitaxial layer by using PECVD;

S22. providing, by photolithography, a window on the mask layer on a position where the trench is to be etched;

S23. removing, by using buffered hydrofluoric acid, the mask layer that is not covered by a photoresist.

In one of the embodiments, the p-type high-concentration GaN layer is etched and then the n-type lightly doped epitaxial layer is grown by selective epitaxiation.

Compared with the prior technology, the invention has the following beneficial effects:

1. Improve the anti-surge current ability: in the present invention, a window is firstly provided on the dielectric layer, and then the deposited anode metal is connected to the p-type high-concentration GaN layer through the window, and p-type high-concentration GaN layer and n-type lightly doped epitaxial layer form a pn junction. When the forward bias reaches about 0.7V, the Schottky junction opens firstly. When the forward voltage reaches about 3V, the pn junction is also opened to form an additional current discharge path, which can absorb large current when the device encounters a short-time voltage pulse or short-time current pulse and prevent the device from burning out.

2. Improve the reliability of the dielectric layer: In the present invention, the p-type high-concentration GaN layer is epitaxially grown at the bottom of the trench to avoid lattice damage and low hole concentration caused by ion implantation, and the p-GaN region with higher concentration can be obtained, and then the dielectric layer is deposited on the p-type high-concentration GaN layer. Compared with a single dielectric layer, this preparation method in the present invention can transfer the extremely high electric field peak at the corner of the dielectric layer to the pn junction interface, greatly reducing the electric field in the dielectric layer,

5 and the longitudinal electric field distribution is more uniform, thereby improving the breakdown voltage of the device.

BRIEF DESCRIPTION OF THE DRAWINGS

FIGS. 1-6 are schematic diagrams showing the process procedure of the device in embodiment 1 of the present invention, wherein FIG. 6 represents the overall structure schematic diagram of the device in embodiment 1.

FIGS. 7 to 8 are schematic diagrams of the process procedure of the device in embodiment 2 of the present invention, wherein FIG. 8 represents the overall structure schematic diagram of the device in embodiment 2.

FIGS. 9 to 15 are schematic diagrams of the process procedure of the device in embodiment 3 of the present invention, wherein FIG. 15 represents the overall structure schematic diagram of the device in embodiment 3.

FIGS. 19 to 20 are schematic diagrams of the process procedure of the device in embodiment 5 of the present invention, wherein FIG. 20 represents the overall structure schematic diagram of the device in embodiment 5.

Figure 1:
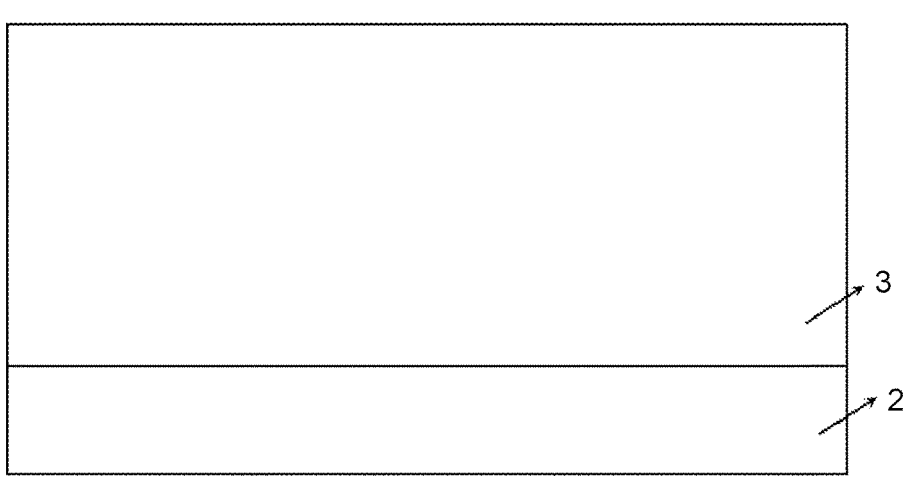

Reference numerals in the accompanying drawings: 1: cathode; 2. substrate; 3: n-type lightly doped epitaxial layer; 4: p-type high-concentration GaN layer; 5: dielectric layer; 6: anode; 7: mask layer; 8: photoresist.

DETAILED DESCRIPTION

The accompanying drawings are for illustrative purposes only and shall not be construed as a limitation to the present invention. In order to better illustrate this embodiment, some parts in the accompanying drawings may be omitted, enlarged or reduced, which does not represent the size of the actual product. For those skilled in the art, it is understandable that some of the well-known structures and descriptions in the accompanying drawings may be omitted. The position relationships described in the accompanying drawings are for illustrative purposes only and shall not be construed as limitations to the present invention.

Embodiment 1

A GaN-based trench metal oxide Schottky barrier diode in this embodiment, including a GaN self-supporting substrate 2, is shown in FIG. 6. An n-type lightly doped epitaxial layer 3 is arranged on the substrate. A plurality of parallel arranged trench structures are formed in the n-type lightly doped epitaxial layer 3, and each of the trench structures includes a p-type high-concentration GaN layer 4 formed at the bottom and a dielectric layer 5 formed on the inner surface; the dielectric layer 5 is provided with a small window in the middle of the trench; at the same time, Schottky contact is formed by the dielectric layer 5 with the n-type lightly doped epitaxial layer of the device, and ohmic contact metal layer—anode 6 is formed by the dielectric layer 5 with the p-type high-concentration GaN layer. A metal layer covering the substrate surface forms an ohmic contact—cathode 1.

The specific preparation method of this embodiment, as shown in FIGS. 1-6, includes the following steps:

1. Formation of initial epitaxial structure

The n-type lightly doped epitaxial layer 3 is epitaxially grown on the n-type GaN low resistivity self-supporting substrate 2. The thickness of the n-type lightly doped epitaxial layer 3 is 1 $\mu$m to 20 $\mu$m, and the doping concentration of the n-type lightly doped epitaxial layer 3 is $1 \times 10^{15}$ $cm^{-3}$ to $1 \times 10^{17}$ $cm^{-3}$. The completed structure is shown in FIG. 1.

In this embodiment, the preferred doping concentration of the epitaxial layer is $1 \times 10^{16}$ $cm^{-3}$.

It should be noted that the substrate also needs to be organically cleaned to remove surface impurities before growing the n-type lightly doped epitaxial layer.

2. Trench structure is formed in the n-type lightly doped epitaxial layer

Figure 2:
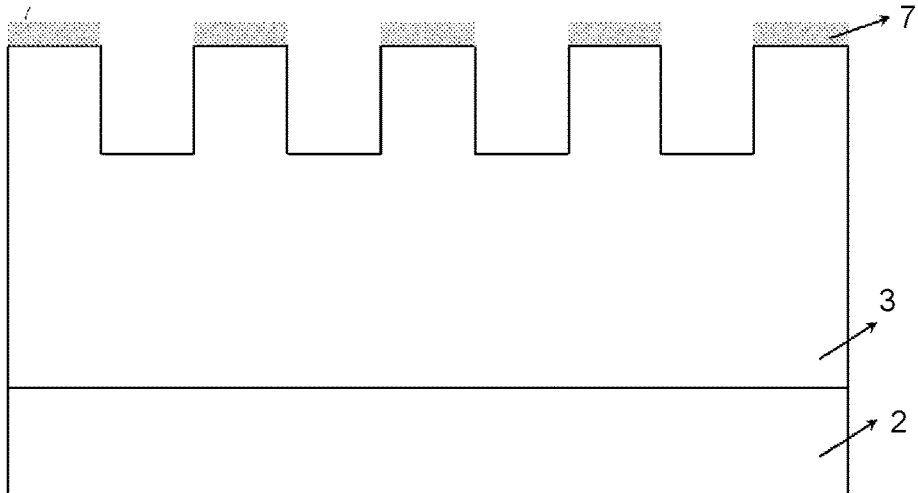

Further, step 2 includes the following steps:

2.1. on the n-type lightly doped epitaxial layer 3, $SiO_2$ is deposited by PECVD as the mask layer 7;

2.2. the mask layer 7 is coated with photoresist 8, exposure and development form a window for trench etching, and buffer hydrofluoric acid is used to selectively remove the mask layer 7;

2.3. the epitaxial wafer is etched by inductively coupled plasma (ICP) etching, and the n-type lightly doped epitaxial layer 3 without mask covered is etched into trenches;

2.4. use acetone to remove the photoresist 8, and the device structure completed is shown in FIG. 2.

Furthermore, reactive ion etching (RIE) process can be used to etch the n-type lightly doped epitaxial layer 3.

Further, different trench depths can be obtained by varying ICP etching time and power.

3. Epitaxy at the bottom of the trench to form the p-type high-concentration GaN layer 4

Figure 3:
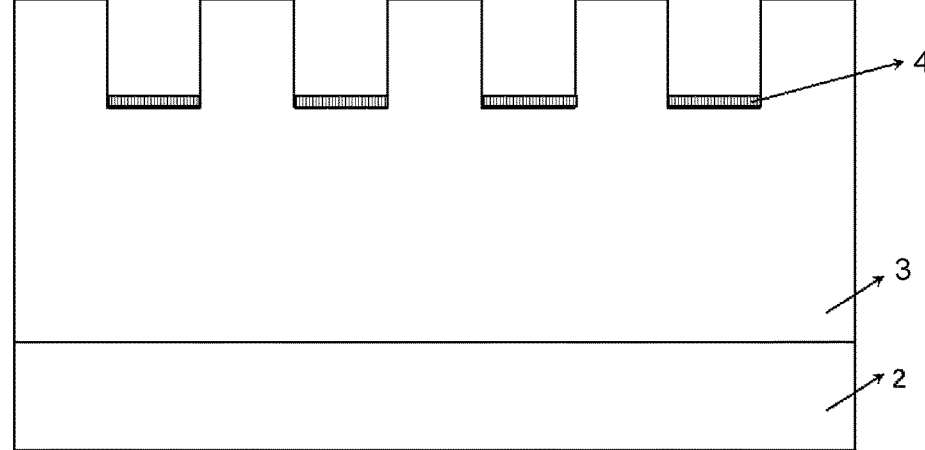

3.1. put the epitaxial wafer into the MOCVD equipment to grow the p-type high-concentration GaN layer 4;

3.2. the mask layer 7 is removed by using buffered hydrofluoric acid, and the structure completed is shown in FIG. 3.

Further, the thickness of the p-type high-concentration GaN layer is 0.2 $\mu$m to 2 $\mu$m, and the hole concentration of the p-type high-concentration GaN layer is $1 \times 10^{16}$ $cm^{-3}$ to $1 \times 10^{19}$ $cm^{-3}$.

Further, the p-type dopant is magnesium; the p-type high-concentration GaN layer includes a plurality of parallel arranged GaN strips with the width of 2 $\mu$m, and the spacing between the adjacent GaN strips is 1 $\mu$m to 4 $\mu$m.

4. Dielectric layer is formed at the sidewall and bottom of the trench 4.1. deposit the dielectric layer on the front surface of the device through ALD;

4.2. photoresist is coated on the front surface of the device, and then exposed and developed to remove the photoresist on the mesa;

4.3. dielectric layer 5 is etched to remove the dielectric layer 5 covered on the mesa;

4.4. use acetone to remove the remaining photoresist in the trench, and then carry out organic cleaning on the surface; the device completed is shown in FIG. 4.

5. Make holes (i.e., the window) in the dielectric layer 5.

5.1. Photoresist 8 is coated on the front surface of the device, and then exposed and developed to form the contact hole window of the dielectric layer 5;

5.2. Use buffered hydrofluoric acid to remove the dielectric layer 5 that is not obscured by the photoresist;

5.3. Use acetone to remove the remaining photoresist 8, and the device structure completed is shown in FIG. 5;

6. Electrode evaporation 6.1. Evaporate Ti/Al/Ni/Au on the back surface of the epitaxial wafer to form ohmic contact as the cathode 1 of the device;

6.2. Evaporate Ni/Au metal on the front surface, and the Ni/Au metal forms Schottky contact with the n-type lightly doped epitaxial layer 3. Through the contact hole of the dielectric layer 5, ohmic contact is formed by Ni/Au metal and p-type high-concentration GaN layer, and the device structure completed is shown in FIG. 6.

Specifically, after the Ni/Au metal is evaporated, it needs to conduct thermal oxidation at high temperature to the Ni/Au metal form ohmic contact with p-type high-concentration GaN layer.

Embodiment 2

Figure 7:
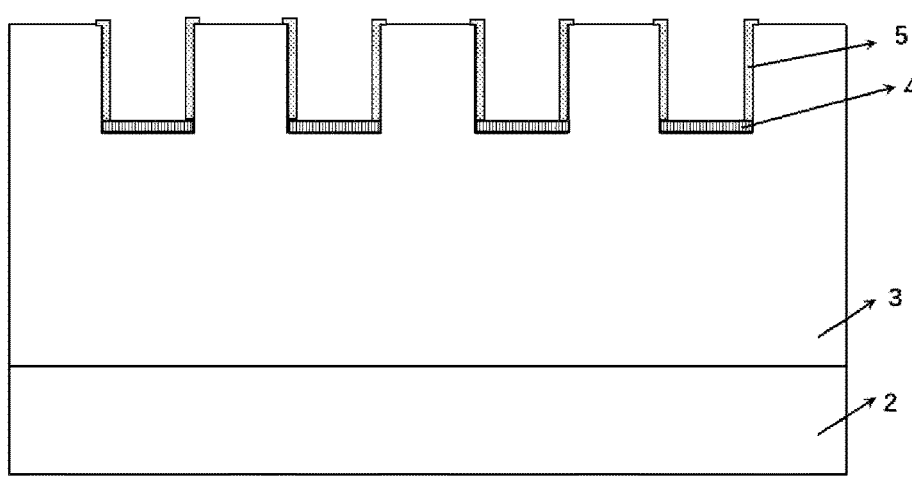

The final device structure of this embodiment is shown in FIG. 7. Compared with embodiment 1, the difference lies in that after the epitaxy of the p-type high-concentration GaN layer 4 is completed, the following process steps are carried out in this embodiment:

1. MIS structure is formed on sidewall 1.1. the atomic layer deposition method is adopted to deposit a region of the dielectric layer 5 on the device surface;

1.2. the photoresist is coated on the dielectric layer 5, and the photoresist on the n-type lightly doped epitaxial layer 3 and p-type high-concentration GaN layer of the device is removed after exposure and development;

1.3. buffer hydrofluoric acid etching is used to remove the dielectric layer 5 not covered by the photoresist;

1.4. acetone is used to remove the photoresist, and the device structure completed is shown in FIG. 7.

Figure 8:
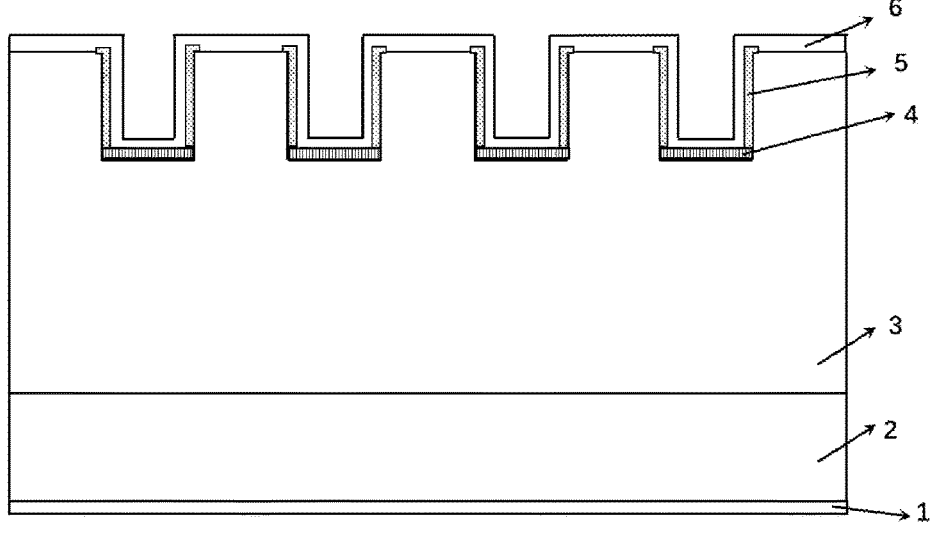

2. Electrode evaporation 2.1. Evaporate Ti/Al/Ni/Au on the back surface of the epitaxial wafer to form ohmic contact as the cathode 1 of the device;

2.2. Evaporate Ni/Au or Pd metal on the front surface, and the Ni/Au or Pd metal forms Schottky contact with the n-type lightly doped epitaxial layer 3 and forms ohmic contact with the p-type high-concentration GaN layer 4. The device structure completed is shown in FIG. 8.

Embodiment 3

Figure 12:
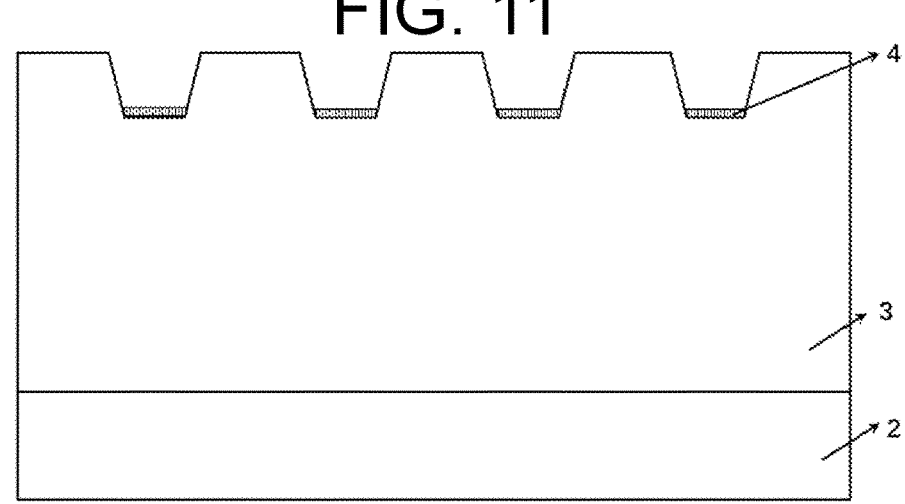

The final device structure of this embodiment is shown in FIG. 12. Compared with embodiment 1, the difference lies in that the trench etching step 2 after the formation of the initial epitaxial structure. The remaining steps are similar to that of embodiment 1. The following process steps are carried out in this embodiment:

1. The trench structure is formed within the n-type lightly doped epitaxial layer 3

Figure 9:
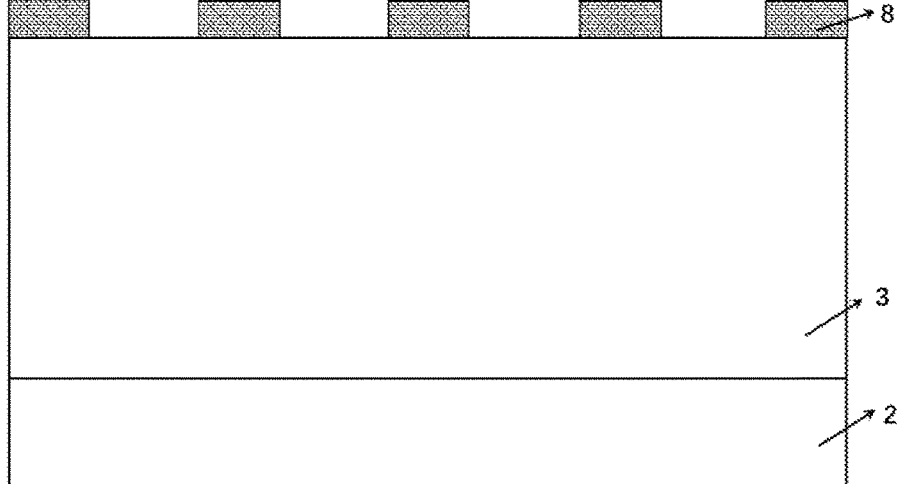
Figure 10:
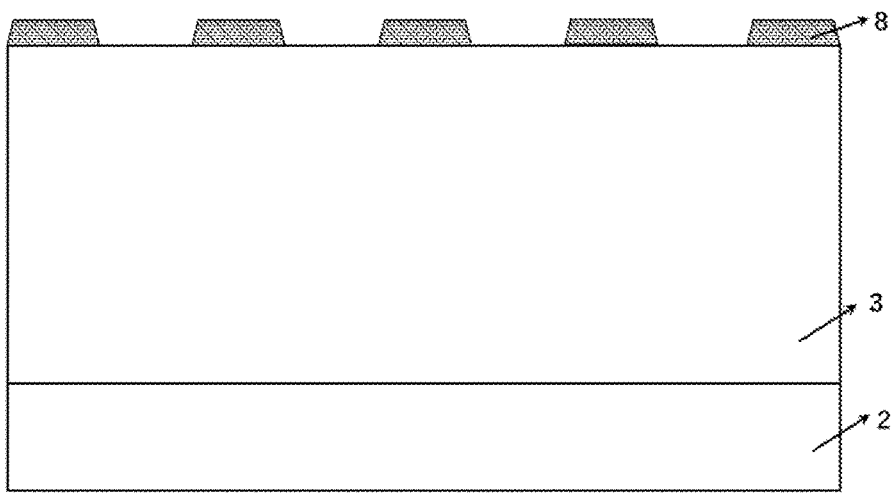
Figure 11:
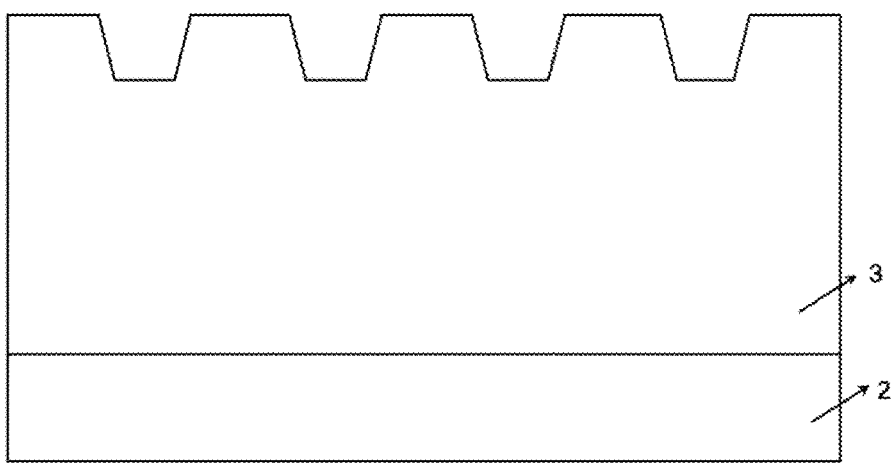

1.1. the n-type lightly doped epitaxial layer 3 is coated with photoresist 8 with the thickness of 4 μm to 6 μm, and the device structure is shown in FIG. 9;

1.2. place the wafer on a heating plate at a constant temperature and heat it to make the photoresist 8 reflux quickly, and the device structure is shown in FIG. 10;

1.3. use the photoresist 8 as the blocking layer, and ICP is used to etch the n-type lightly doped epitaxial layer 3 to form a tilted mesa structure;

1.4. use acetone to remove the photoresist 8, and the device structure completed is shown in FIG. 11.

2. Epitaxy at the bottom of the trench to form the p-type high-concentration GaN layer 4

2.1. deposit the mask layer 7 on the surface of the device by PECVD, and remove the photoresist 8 at the bottom of the trench after exposure and development, and retain the photoresist 8 on the top of the n-type lightly doped epitaxial layer 3 of the device and the sidewall of the trench;

2.2. buffer hydrofluoric acid is used to selectively remove the mask layer 7 at the bottom of the trench;

2.3. put the epitaxial wafer into the MOCVD equipment to grow the p-type high-concentration GaN layer 4 at the bottom of the trench;

2.4. remove the remaining mask after the growth is completed, and the device structure completed is shown in FIG. 12.

The thickness of the p-type high-concentration GaN layer 4 is 0.2 μm to 2 μm, and the hole concentration of the p-type high-concentration GaN layer 4 is $1 \times 10^{16}$ cm$^{-3}$ to $1 \times 10^{19}$ cm$^{-3}$. The p-type dopant is usually magnesium.

Further, the p-type high-concentration GaN layer 4 includes a plurality of parallel arranged GaN strips with the width of 2 μm, and the spacing between the adjacent GaN strips is 1 μm to 4 μm.

Figure 13:
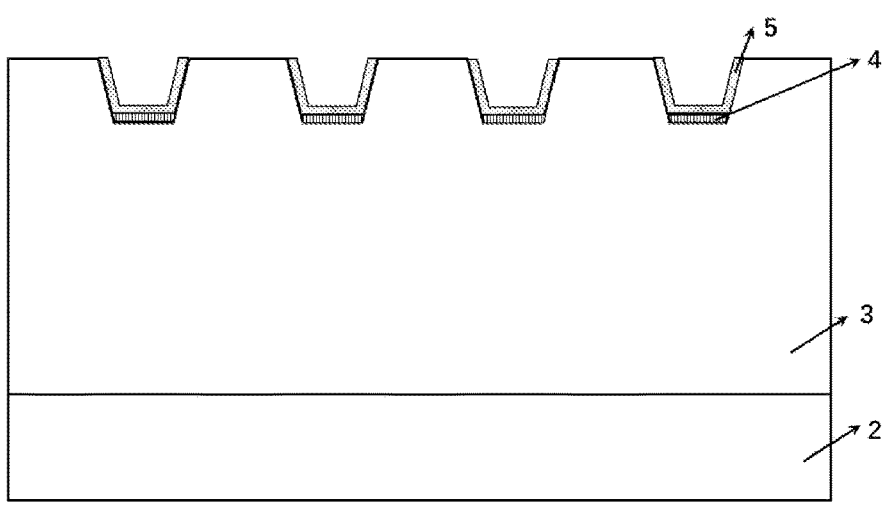

3. The dielectric layer 5 is formed at the sidewall and bottom of the trench 3.1. deposit the dielectric layer 5 on the front surface of the device through ALD;

3.2. photoresist is coated on the front surface of the device, and then exposed and developed to remove the photoresist on the mesa;

3.3. dielectric layer 5 is etched to remove the dielectric layer covered on the mesa;

3.4. use acetone to remove the remaining photoresist in the trench, and then carry out organic cleaning on the surface; and the device structure completed is shown in FIG. 13.

4. Make holes (i.e., the window) in the dielectric layer 5

Figure 14:
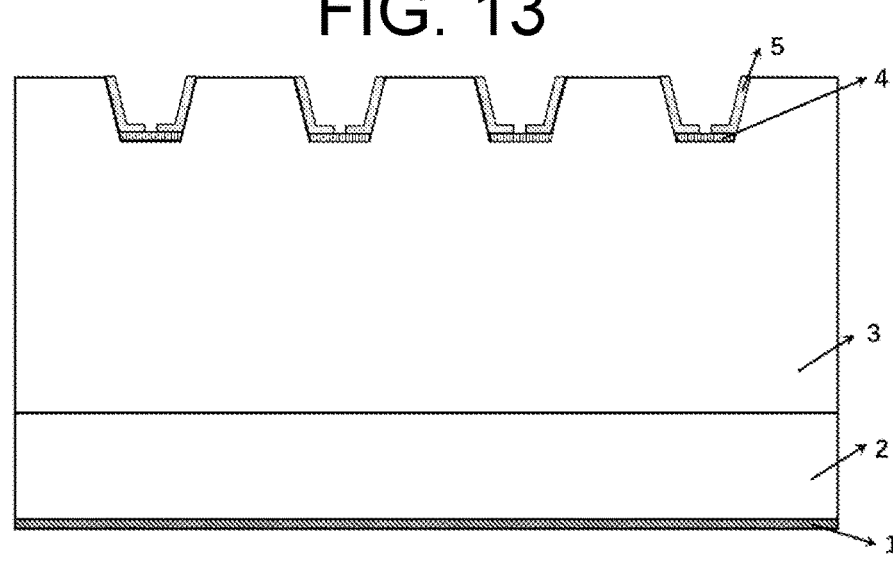
Figure 15:
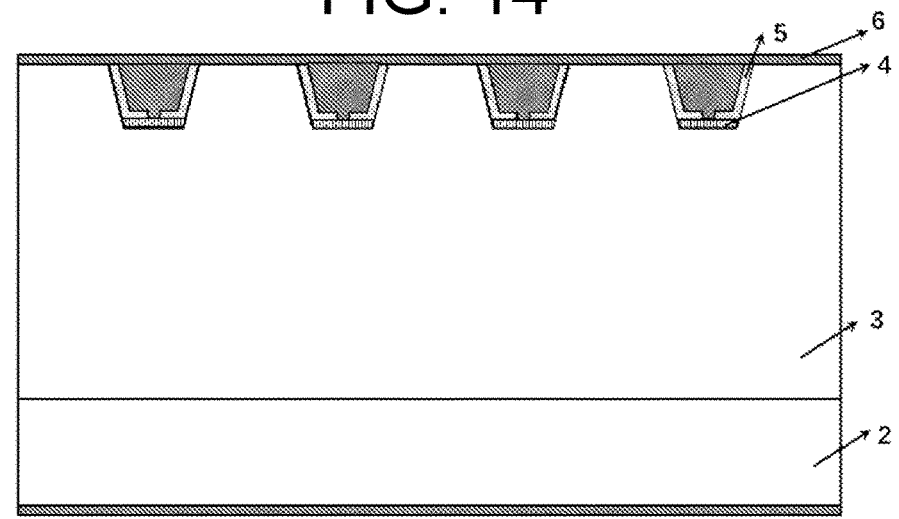

4.1. photoresist 8 is coated on the front surface of the device, and then exposed and developed to form the contact hole window of the dielectric layer 5;

4.2. use buffered hydrofluoric acid to remove the dielectric layer 5 that is not obscured by the photoresist 8;

4.3. Use acetone to remove the remaining photoresist 8, and the device structure completed is shown in FIG. 14;

5. Electrode evaporation 5.1. Evaporate Ti/Al/Ni/Au on the back surface of the epitaxial wafer to form ohmic contact, which acts as the cathode of the device 1;

5.2. Evaporate Ni/Au or Pd metal on the front surface, the Ni/Au or Pd metal forms Schottky contact with the n-type lightly doped epitaxial layer 3 and forms ohmic contact with the p-type high-concentration GaN layer 4 through the contact hole of the dielectric layer 5. The device structure completed is shown in FIG. 15.

Specifically, after the Ni/Au metal is evaporated, it is necessary to conduct thermal oxidation to the Ni/Au metal at high temperature to form ohmic contact with the p-type high-concentration GaN layer.

Embodiment 4

Figure 19:
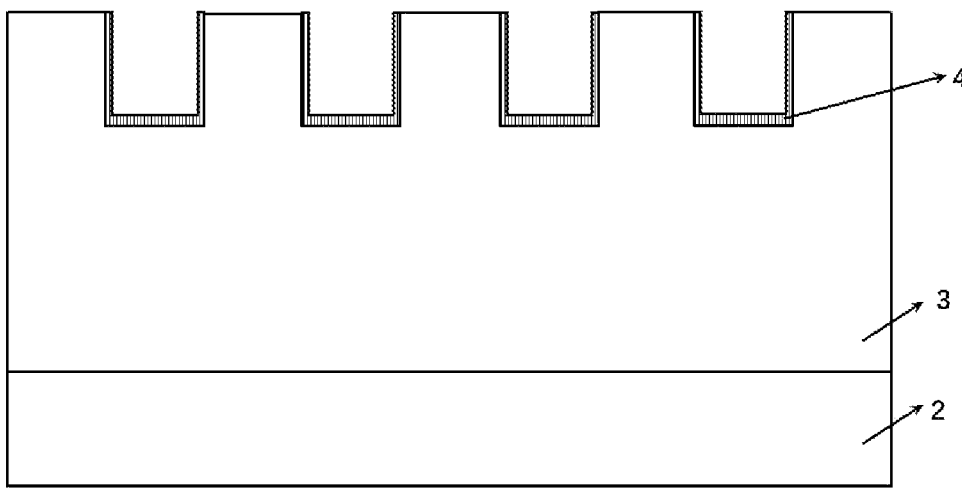

The final device structure of this embodiment is shown in FIG. 19, which is consistent with the final structure of embodiment 1. Its fabrication process is different from that of embodiment 1. The difference is that in this embodiment, the p-type high-concentration GaN layer 4 is etched firstly, and then the n-type lightly doped epitaxial layer 3 is selective-area epitaxially grown. The remaining steps are similar to those of embodiment 1, and the following process steps are carried out in this embodiment:

1. Formation of initial epitaxial structure

Figure 16:
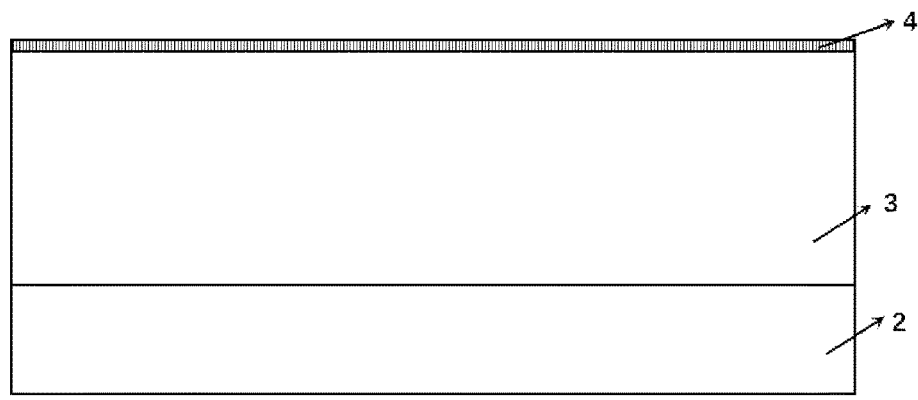
FIGS. 16 to 18 are schematic diagrams of the process procedure of the device in embodiment 4 of the present invention. The overall structure schematic diagram of the device in embodiment 4 is shown in FIG. 6, which is consistent with the overall structure schematic diagram of the device in embodiment 1, except that the manufacturing process steps are different.

The n-type lightly doped epitaxial layer 3 is epitaxially grown on n-type GaN low resistivity self-supporting substrate 2, and then after then-type lightly doped epitaxial layer 3 is grown, a p-type conductive p-type high-concentration GaN layer 4 is continued to be grown. The epitaxial structure of the material when this step is completed is shown in FIG. 16.

Figure 17:
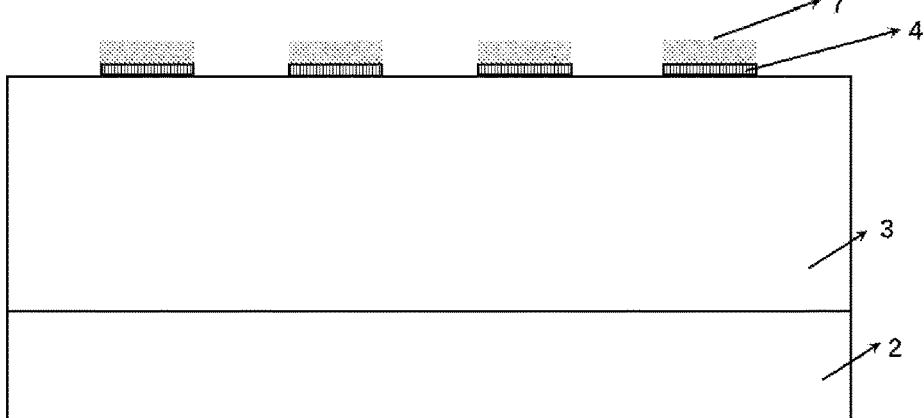
Figure 18:
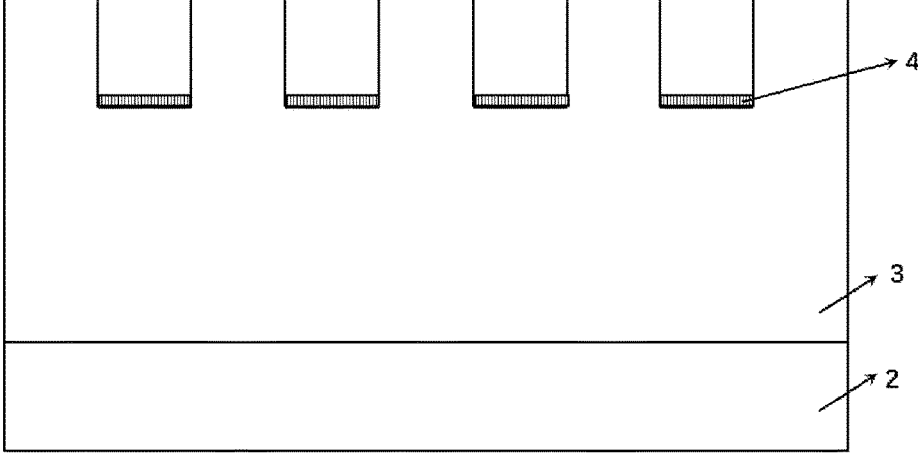

2. Selective-Area Etching and Epitaxy 2.1. deposit SiO₂ on the p-type high-concentration GaN layer 4 through PECVD as the mask layer 7;

2.2. coat the photoresist on the SiO₂ mask layer 7, expose the mask to be removed after exposure and development, and use buffer hydrofluoric acid solution to selectively etch the mask area;

2.3. ICP is used to etch the epitaxial wafer, and the trench is etched in the p-type high-concentration GaN layer 4 which is not covered by mask layer 7. The device structure completed is shown in FIG. 17;

2.4. put the epitaxial wafer into the epitaxial chamber to grow the n-type lightly doped epitaxial layer 3, and remove the remaining mask layer after the n-type lightly doped epitaxial layer 3 is grown. The structure completed is shown in FIG. 18.

The subsequent steps are consistent with those of embodiment 1 and will not be repeated here. The final device structure is shown in FIG. 6.

Embodiment 5

Figure 20:
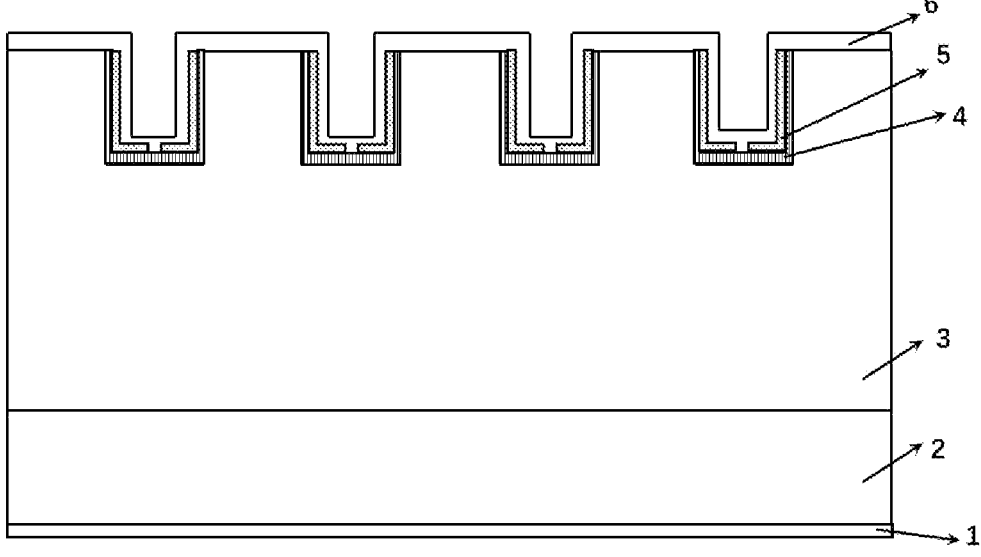

The final device structure of this embodiment is shown in FIG. 20. The process procedure of this embodiment is similar to that of embodiment 1. By controlling the factors of step 3 of embodiment 1: chamber pressure, growth time, temperature, source flow rate, source flux, etc., during the epitaxy of the p-type high-concentration GaN layer 4, the p-type high-concentration GaN layer 4 of a certain thickness can also be grown on the sidewall to form the structure shown in FIG. 19. The other steps are consistent with that of embodiment 1. The device structure of this embodiment is formed after the dielectric layer is deposited and holes is made in the dielectric layer 5 and the electrode is evaporated, as shown in FIG. 20.

In the embodiment of the invention, the dielectric layer of the device is specially treated, and a small contact hole made such that the anode metal contacts with the p-type high-concentration GaN layer 4. Therefore, the anti-surge current ability of the device is significantly improved. At the same time, in the reverse bias, the p-type high-concentration GaN layer 4 under the dielectric layer 5 can reduce the high electric field at the corner of the dielectric layer 5, and the longitudinal electric field distribution is more uniform, so the reliability of the dielectric layer 5 is enhanced and the breakdown voltage increased.

In the description of the invention, it should be understood that, the term "center", "vertical", "horizontal", "length", "width", "thickness" and "up", "down", "front" and "back", "left", "right" and "vertical", "horizontal", "top", "bottom", "inside", "outside", "clockwise" "counterclockwise" and "rotate"," "axial", "radial", "circumferentially", etc., indicating the orientation or position relationship based on the orientation or position relationship shown in the accompanying drawings, only for the convenience of describing and simplifying the description of the invention, but not to indicate or imply that the device or element referred to must have a specific orientation, construction and operation in a specific orientation, and therefore cannot be understood as a limitation to the invention.

In addition, the terms "first" and "second" are only used for the purpose of describing and cannot be understood as indicating or implying relative importance or implying the quantity of technical features indicated. Therefore, features limited to "first" and "second" can explicitly or implicitly include at least one of these features. In the description of the present invention, "multiple" means at least two, such as two, three, etc., unless otherwise specifically defined.

In the present invention, unless otherwise specified and limited, the terms "installation", "interconnection", "connection", "fixation" and other terms should be broadly understood, for example, they can be fixed connections, detachable connections, or integrated; It can be a mechanical connection or an electrical connection; It can be directly connected or indirectly connected through an intermediate medium, which can be the internal communication between two components or the interaction relationship between two components, unless otherwise specified. For an ordinary skilled person in the art, the specific meanings of the above terms in the present invention can be understood based on specific circumstances.

In the present invention, unless otherwise specified and limited, the first feature "above" or "below" the second feature may mean that the first feature is in direct contact with the second feature, or that the first may be in indirect contact with second features through intermediate media. Moreover, the first feature "over", "above", and "above" the second feature may mean that the first feature is directly or diagonally above the second feature, or simply indicates that the first feature is horizontally higher than the second feature. The first feature "below", "under", and "lower" the second feature can indicate that the first feature is directly or diagonally below the second feature, or simply indicates that the horizontal height of the first feature is less than that of the second feature.

In the description of this specification, the reference to terms such as "one embodiment", "some embodiments", "examples", "specific examples", or "some examples" means that the specific features, structures, materials, or features described in conjunction with the embodiment or example are included in at least one embodiment or example of the present invention. In this specification, the schematic expressions of the above terms do not necessarily refer to the same embodiments or examples. Moreover, the specific features, structures, materials, or features described can be combined in an appropriate manner in any one or more embodiments or examples. In addition, those skilled in the art may combine the different embodiments or examples described in this specification, as well as combine the features of different embodiments or examples, without mutual contradiction.

Although embodiments of the present invention have been shown and described above, it can be understood that the above embodiments are exemplary and cannot be understood as limitations to the present invention. An ordinary skilled person in the art can make changes, modifications, substitutions, and variations to the above embodiments within the scope of the present invention.

Obviously, the above embodiments of the present invention are only examples to clearly illustrate the present invention, and are not limiting the implementation methods of the present invention. For ordinary skilled person in the art, different forms of changes or alteration can be made based on the above explanations. There is no need and cannot be an exhaustive list of all implementation methods here. Any modifications, equivalent substitutions, and improvements made within the spirit and principles of the present invention shall be included within the scope of protection of the claims of the present invention.

What is claimed is:

1. A GaN-based trench metal oxide Schottky barrier diode, the GaN-based trench metal oxide Schottky barrier diode from top to bottom comprises: a cathode covering a substrate; the substrate; an n-type lightly doped epitaxial layer; a p-type high-concentration GaN layer located in a bottom of a trench, a dielectric layer on an inner surface of the trench; an anode located on an upper surface of the GaN-based trench metal oxide Schottky barrier diode, wherein a plurality of parallel arranged trench structures are formed on a surface of the n-type lightly doped epitaxial layer, wherein the dielectric layer covers on an inner wall of the trench and located above the p-type high-concentration GaN layer, and a window is provided on a middle position above the p-type high-concentration GaN layer, and wherein a tilt angle of a mesa of the GaN-based trench metal oxide Schottky barrier diode is less than 90 degree, and the trench is fully filled with the anode.

2. The GaN-based trench metal oxide Schottky barrier diode according to claim 1, wherein the p-type high-concentration GaN layer is also provided on a side wall of the trench.

3. The GaN-based trench metal oxide Schottky barrier diode according to claim 1, wherein the substrate is an n-type GaN self-supporting substrate, a resistivity range of the substrate is $0.001 \ \Omega \cdot cm$ to $0.05 \ \Omega \cdot cm$, a thickness of the substrate is 350 μm to 400 μm, the n-type lightly doped epitaxial layer is an unintentionally doped epitaxial layer, Si-doped epitaxial layer, or As-doped epitaxiy layer; a thickness of the n-type lightly doped epitaxial layer is 1 μm to 30 μm, and a doping concentration of the n-type lightly doped epitaxial layer is $1 \times 10^{14} \ cm^{-3}$ to $5 \times 10^{17} \ cm^{-3}$; the p-type high-concentration GaN layer is p-GaN material formed by epitaxy, a thickness of the p-type high-concentration GaN layer is 0.2 μm to 2 μm, a hole concentration of the p-type high-concentration GaN layer is $1 \times 10^{16} \ cm^{-3}$ to $1 \times 10^{19} \ cm^{-3}$; the dielectric layer is $SiO_2$, $Al_2O_3$, $Si_3N_4$, or $HfO_2$, and a thickness of the dielectric layer is 0.05 μm to 0.6 μm; a material of the cathode is any one of Ti/Al/Ni/Au alloy, Ti/Al/Ti/Au alloy, Ti/Al/Mo/Au alloy, and Ti/Al/Ti/TiN alloy, and a material of the anode is one of Ni, Au, Be, Pt and Pd or a stacking structure of Ni, Au, Be, Pt and Pd.

* * * * *